(12) United States Patent
Sada et al.

(10) Patent No.: US 7,554,297 B2
(45) Date of Patent: Jun. 30, 2009

(54) AUTOMOTIVE BATTERY STATE MONITOR APPARATUS

(75) Inventors: Takeshi Sada, Toyota (JP); Makoto Taniguchi, Obu (JP); Atsushi Ichikawa, Toyoake (JP)

(73) Assignee: Denso Corporation, Kariya (JP)

( * ) Notice: Subject to any disclaimer, the term of this patent is extended or adjusted under 35 U.S.C. 154(b) by 8 days.

(21) Appl. No.: 11/826,627

(22) Filed: Jul. 17, 2007

(65) Prior Publication Data
US 2007/0257641 A1    Nov. 8, 2007

Related U.S. Application Data

(62) Division of application No. 10/868,921, filed on Jun. 17, 2004, now Pat. No. 7,317,300.

(30) Foreign Application Priority Data

Jun. 23, 2003  (JP)  ............................. 2003-178131
Jun. 25, 2003  (JP)  ............................. 2003-180972

(51) Int. Cl.
    *H02J 7/00* (2006.01)
(52) U.S. Cl. ....................... 320/132; 324/429
(58) Field of Classification Search ................. 320/104, 320/136; 324/424, 425, 426, 427
    See application file for complete search history.

(56) References Cited

U.S. PATENT DOCUMENTS

| | | | |
|---|---|---|---|
| 4,651,081 A * | 3/1987 | Nishimura et al. | 320/123 |
| 6,366,054 B1 * | 4/2002 | Hoenig et al. | 320/132 |
| 6,388,447 B1 * | 5/2002 | Hall et al. | 324/426 |
| 6,441,619 B1 * | 8/2002 | Araki et al. | 324/427 |
| 6,531,874 B2 | 3/2003 | Mentgen et al. | |
| 6,583,606 B2 | 6/2003 | Koike et al. | |
| 6,608,482 B2 * | 8/2003 | Sakai et al. | 324/426 |
| 6,617,703 B2 | 9/2003 | Matsubara et al. | |
| 7,034,504 B2 * | 4/2006 | Arai et al. | 320/132 |

(Continued)

FOREIGN PATENT DOCUMENTS

EP           0 508 030 A       10/1992

(Continued)

OTHER PUBLICATIONS

Aylor, J. H. et al., "A Battery State-of-Charge Indicator for Electric Wheelchairs", IEEE Transactions on Industrial Electronics, IEEE Service Center, Piscataway, NJ, vol. 39, No. 5, Oct. 1, 1992, pp. 398-409.

*Primary Examiner*—Akm E Ullah
*Assistant Examiner*—Samuel Berhanu
(74) *Attorney, Agent, or Firm*—Oliff & Berridge, PLC

(57) ABSTRACT

A voltage control apparatus checks a battery voltage when an automotive generator gradually increases its output to be within a predetermined range after temporarily stopping the generator. Then, the battery voltage is picked up to calculate the charge rate. Further, a first charge rate and a first residual capacity of the battery is memorized when the engine is stopped. Periodically, a pseudo-open circuit voltage is checked when a charge/discharge current fits within a predetermined small range while the engine is not running, and a second charge rate calculated based on the checked pseudo-open circuit voltage. A second residual capacity is calculated using the first charge rate, the first residual capacity and the second charge rate.

11 Claims, 8 Drawing Sheets

U.S. PATENT DOCUMENTS

| | | | |
|---|---|---|---|
| 7,456,612 B2 * | 11/2008 | Murakami ................. | 320/132 |
| 2002/0101243 A1 | 8/2002 | Mentgen et al. | |
| 2003/0146737 A1 * | 8/2003 | Kadouchi et al. .......... | 320/132 |

FOREIGN PATENT DOCUMENTS

| EP | 1 314 992 A2 | 5/2003 |
|---|---|---|
| JP | A-07-063830 | 3/1995 |
| JP | A-08-029505 | 2/1996 |
| JP | A-10-319100 | 12/1998 |
| JP | A-11-103505 | 4/1999 |
| JP | B2-2910184 | 4/1999 |
| JP | A-2000-123886 | 4/2000 |
| JP | A-2000-306613 | 11/2000 |
| JP | A-2001-097150 | 4/2001 |
| JP | A-2001-343437 | 12/2001 |
| JP | A-2002-250757 | 9/2002 |
| JP | A-2003-068369 | 3/2003 |
| JP | A-2003-134678 | 5/2003 |
| WO | WO 86/07502 | 12/1986 |

\* cited by examiner

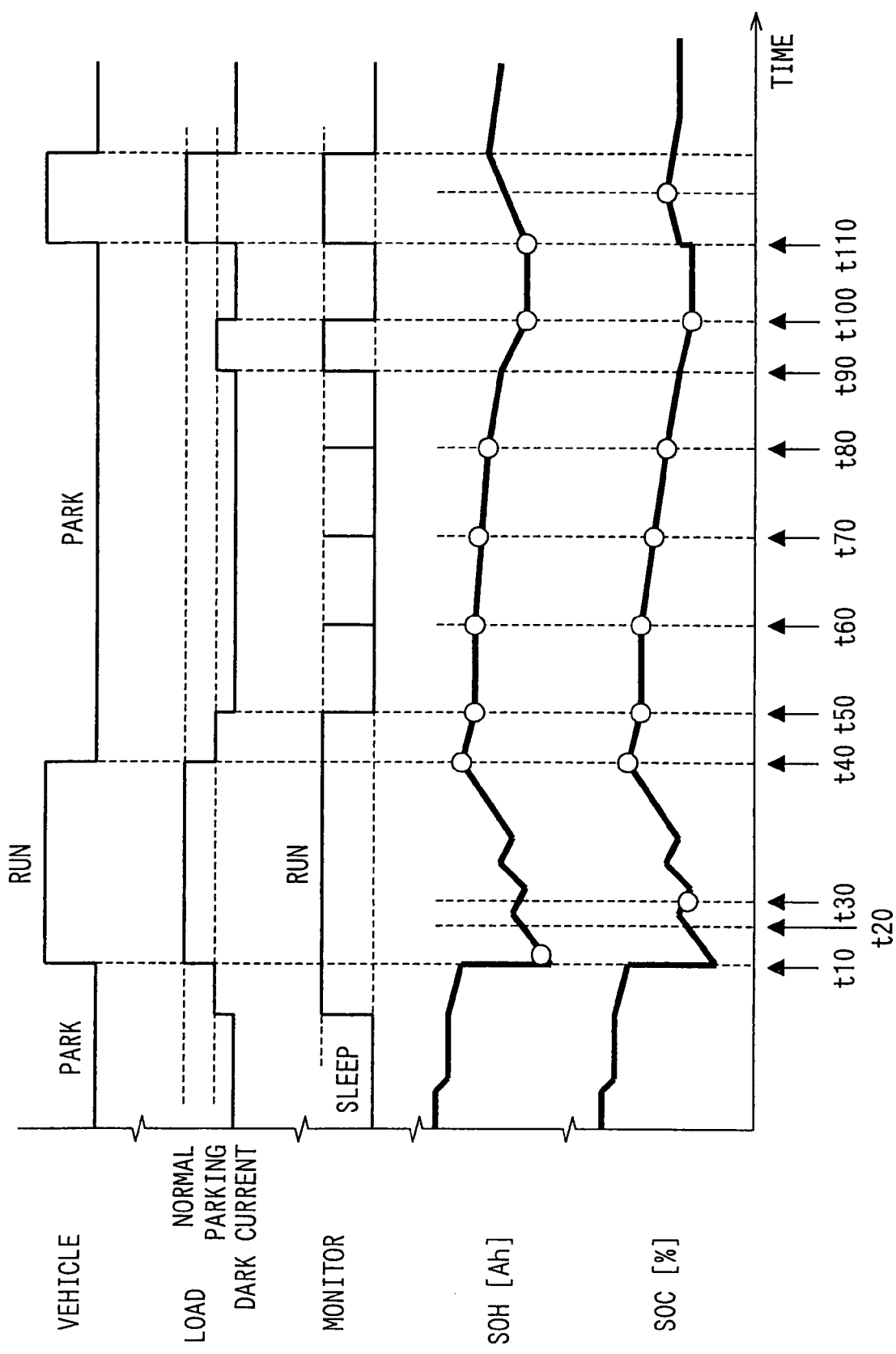

AUTOMOTIVE BATTERY STATE MONITOR APPARATUS

This is a Division of application Ser. No. 10/868,921 filed Jun. 17, 2004. This application claims the benefit of Japanese patent applications No. 2003-178131 filed on Jun. 23, 2003 and No. 2003-180972 filed on Jun. 25, 2003. The disclosure of the prior applications is hereby incorporated by reference herein in their entirety.

BACKGROUND

The present invention relates to an automotive battery state monitor apparatus and a method of operating the apparatus.

In general, it is recognized that there is a strong correlation between the state of charge (SOC)[%] of a lead storage battery that shows an index of charged electricity in a battery and an open circuit voltage (OCV) which is measured assuming that the battery terminals are disconnected from a circuit. Therefore, it is most convenient to check the OCV in order to take a measurement of SOC, as proposed in U.S. Pat. No. 6,531,874 (JP-A-2002-22268) and JP-A-2002-250757.

However, a lead storage battery mounted on a vehicle (automotive battery) is always connected to an electric device regardless of the vehicle's condition (either running or parking). It is therefore impractical to disconnect the terminals of the battery from the connecting circuit. That is, taking a measurement of OCV of an automotive battery for the purpose of SOC calculation is not realistic.

Also, as shown in JP 2910184, it is proposed that an initial residual capacity is derived from the voltage-current characteristics in terms of a large capacity discharge (burst discharge) during start-up, while running readings of the residual capacity value are derived afterward from the integration value of charge/discharge current of the battery, while an engine is in operation, or in other words, an a.c. generator is generating electricity.

Yet, if this kind of current integration method is employed, it is necessary to put a current sensor and monitor device in operation. Consequently, when the engine is not in operation, or the generator is not generating electricity, a dark current consumed by the current sensor and the monitor device results in a decreased battery capacity, and that substantially makes it impossible to monitor the battery state while the engine is not running.

SUMMARY

The first object of this invention is to obtain an SOC based on a virtually produced OCV state (pseudo-OCV) and pseudo-OCV—SOC correlation without disconnecting the automotive battery terminals from the connecting circuit.

Further, the secondary object of this invention is to enable battery state monitoring during engine stall period while minimizing the dark current.

In order to achieve the first object of the invention, the output of an automotive generator is put in a controlled steady increase after a temporary stoppage of the generator while an engine is in operation. On this condition, a battery voltage value is picked up when a charge/discharge current fits within a predetermined range. Preferably, the limit of the range of the electric current value is equal to or between plus one ampere and minus one ampere.

The controlled operation of the automotive generator to limit the charge/discharge current within a predetermined small range virtually creates a simulated condition of physically disconnected battery terminals, as revealed in an experiment. That is, a presumed state of the battery whose terminals are disconnected from an electrical load can be created. According to this method, an SOC of an automotive battery can be calculated based on the picked-up pseudo-OCV and its correlation to an actual SOC.

Preferably, the controlled output from the generator leads to a polarization state in the battery to be within a predetermined range. Starting from the condition described above, the battery voltage value is picked up when the charge/discharge current, in the course of gradual increase of generator output, fits within a predetermined range.

As an actual SOC varies widely depending on the polarization of the battery, it is widely known that a strict control on the polarization is needed in order to get an accurate SOC reading. As shown in FIG. 6, an actual SOC appears higher against a pseudo-OCV as depicted in a broken line when the battery is in relatively charged condition compared to a balanced one. On the contrary, the actual SOC appears lower against the pseudo-OCV as depicted in an alternate long and short line when the battery is in relatively discharged condition compared to the balanced one. Further, repetitive processes of charging and discharging are depicted as hysteresis curve paths as shown in FIG. 7.

Accordingly, a strict control is required in order to correctly estimate the SOC value. If the pseudo-OCV value is picked up under a condition that the polarization of the automotive battery is kept in a predetermined state, the correlation coefficient between the pseudo-OCV and the actual SOC becomes greater and estimation accuracy can be remarkably improved.

Also, the polarization in the automotive battery has to be controlled within a predetermined range after a predetermined time of starting an engine. Using a starter motor to start an engine requires a higher current, that is, the battery discharges a large current. Therefore, the polarization in the battery is excessive just after starting an engine. This condition accelerates an electrochemical reaction to resolve the excessive polarization, resulting in very unstable internal state. This condition is far from the ideal terminal release condition to be measured. Consequently, the polarization control operation is prohibited during the predetermined period of time after starting of an engine, and the operation is performed when the polarization is resolved after the predetermined period of time.

Preferably, a polarization index $P_n$, when the present charge/discharge current value is picked up, is represented in the following formula, in which $P_{n-1}$ stands for a polarization index of the last sampling, $\Delta t$ stands for a sampling interval of charge/discharge current, and $\tau$ stands for a diffusion constant of electrolyte of the battery.

$$P_n = P_{n-1} + I \cdot \Delta t - P_{n-1} \cdot \Delta t / \tau$$

A quantitative definition in the above formula leads to an accurate control of the polarization.

Also, when a charge/discharge current of the battery fits within a predetermined range, a (terminal) voltage of the battery is picked up and the charge rate of the battery is calculated based on the voltage and is considered as an initial charge rate (SOC). Further, the charge/discharge current of the battery is sampled at the interval of $\Delta t$. The value derived from the product of the sampled current value $I_n$ and the sampling interval $\Delta t$ divided by the battery capacity is added to the initial SOC, one at every sampling, to calculate a battery charge rate.

According to this method, based on an SOC calculated from a sampled OCV, iterated addition of changed value of charge/discharge current (integrated charge/discharge current) can yield an actual SOC of the battery of a running vehicle, and as a result, it can prevent a deterioration of charge condition caused by a frequent release of the battery terminals.

Preferably, the battery state monitor apparatus periodically performs a controlled increase of the output of the generator, in succession to a temporary stoppage, for the battery charge/discharge current to fit within the predetermined small range while the engine is running. According to this method, a pseudo-OCV can be derived periodically, and thus integration of the tolerance originating from the electric current sensor, known as a demerit of the charge/discharge current integration method, can also be periodically diminished.

To achieve the second object of this invention, the terminal voltage that yields a charge/discharge current fitted within a predetermined small range is defined as a pseudo-open circuit voltage (pseudo-OCV). Correlation information that maps this pseudo-OCV to a battery charge rate (SOC: state of charge) is stored. A first charge rate SOC1 of the battery when the engine is stopped and a first residual capacity SOH1 are also stored. A terminal voltage, that is, a pseudo-open circuit voltage is picked up periodically at a certain interval when the battery charge/discharge current fits within a predetermined small range while the engine is not running. A second charge rate SOC2 is calculated based on the picked up pseudo-OCV, and the present residual capacity SOH1 is calculated based on the first charge rate SOC1, the first residual capacity SOH1, and the second charge rate SOC2.

Preferably, should the certain interval be set to several hours, the state monitor device (battery state monitor apparatus) and the electric current sensor need to be operated only when a data is picked up, and can then be turned off to prevent a dark current influx. As a result, the battery state monitor apparatus according to this method can monitor the battery state periodically when the engine is not running and can also resume state monitor after a long period of standing to get the latest state, while suppressing battery capacity decrease caused by discharging.

Preferably, the present residual capacity SOH2 is defined in the following formula.

$$SOH2=(SOH1/SOC1) \cdot SOC2$$

The state monitor apparatus replaces the contents of SOC1 with that of SOC2, and also the contents of SOH1 with that of SOH2 when the SOH2 is calculated. According to this method, as the data are replaced in order, memory capacity of the state monitor device (battery state monitor apparatus) need not be a large size, thus the state monitor apparatus can be inexpensive.

Further, the apparatus begins integration of a discharge current when an electric device is put into operation during an engine stoppage period, and calculates present residual capacity SOH2 by subtracting the integration value from the SOH1 whenever updating. The state monitor device (battery state monitor apparatus) and the electric current sensor can be employed to calculate the actual residual capacity by integrating the discharge current when a substantial current consumption is taking place.

Should a load carrying signal, which notifies start of an operation of an electric device, be sent to the state monitor device at the same time, the state monitor device (battery state monitor apparatus) can simultaneously be put into operation with the electric device. Stopping the state monitor device (battery state monitor apparatus) can also be controlled in the same way, and thus electric current consumption by the ECU can be minimized.

More preferably, SOC2 can be calculated based on the SOC1, the SOC2, and the SOH1 using the following formula.

$$SOC2=(SOC1/SOH1) \cdot SOH2$$

Also, the contents of the SOC1 are replaced with that of SOC2, and the contents of the SOH1 are replaced with the SOH2 when the SOH2 is calculated. Data replacement in the state monitor device (battery state monitor apparatus), as described above, makes the state monitor device to be less memory-demanding.

More preferably, an initial residual capacity, after a discharge current and a terminal voltage of the automotive battery are picked up when the engine is started, is calculated based on these current value and voltage value, and the present residual capacity thereafter is calculated by adding the integration value of charge/discharge current to the initial residual capacity. According to this method, the latest battery state can always be monitored regardless of the vehicle condition (whether it is running or parking).

Also, the automotive generator is stopped temporarily after a predetermined period of time in succession to starting of the engine. The output of the generator is increased gradually when the polarization state of the battery reaches within a predetermined range, in order to control the battery charge/discharge current to be fitted within a predetermined small range. Then, the terminal voltage of the battery is picked up when the charge/discharge current reaches within the predetermined small range.

A controlled situation where the charge/discharge current is nearly equal to zero based on a certain polarization state, virtually creates a simulated (electric) condition of the battery terminals being physically released, according to an experiment. Therefore, according to this method, the SOC at the time of pseudo-OCV measurement can be calculated based on the terminal voltage (pseudo-open circuit voltage: pseudo-OCV) picked up under the above situation and with reference to the correlation information that maps a pseudo-OCV to an SOC.

BRIEF DESCRIPTION OF THE DRAWINGS

The above and other objects, features and advantages of the present invention will become more apparent from the following detailed description made with reference to the drawings. In the drawings;

FIG. 10 shows an operation diagram of an electric load, a battery state monitor device state, the SOC, and the SOH of the vehicle condition in the second embodiment.

DETAILED DESCRIPTION OF THE EMBODIMENT

First Embodiment

Figure 1:
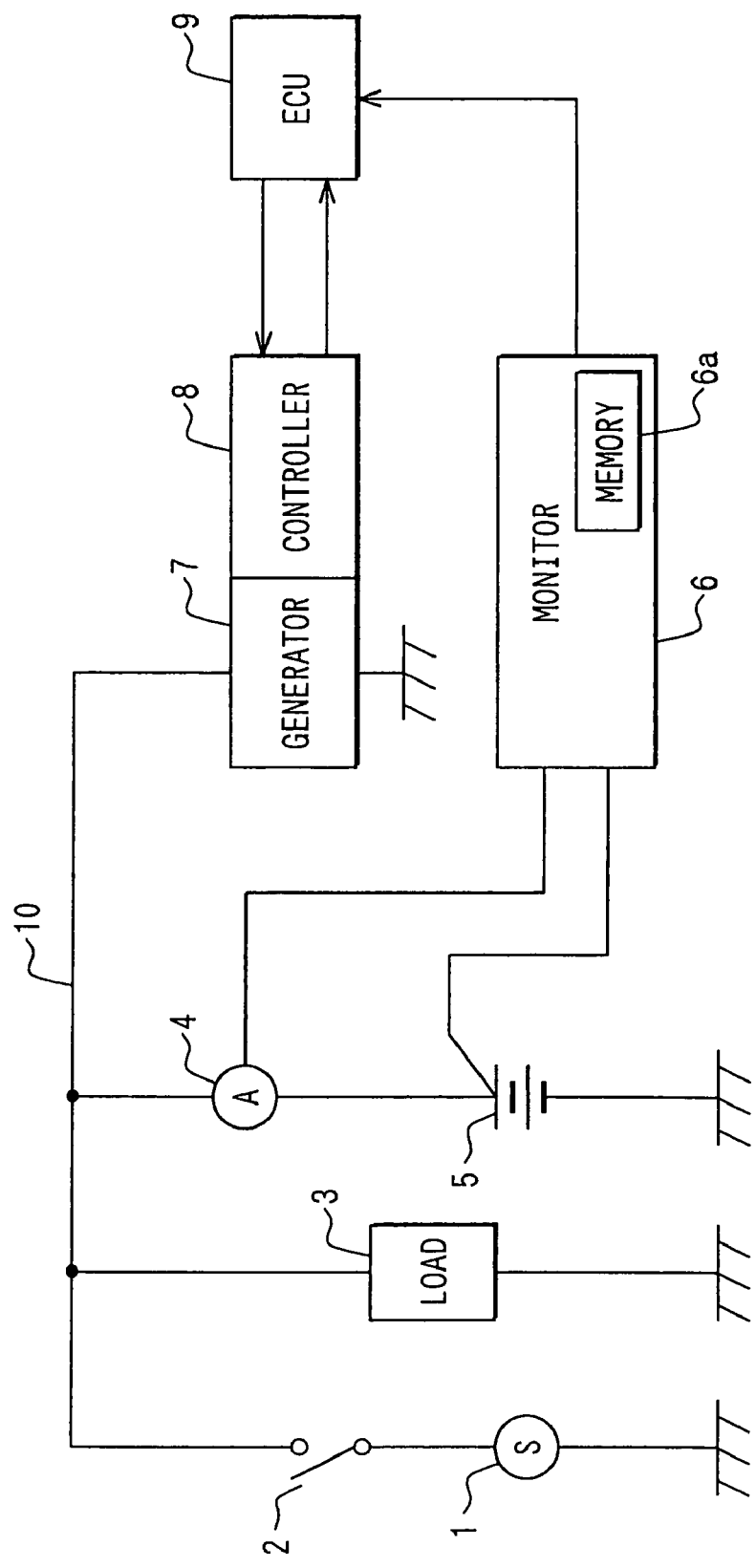
FIG. 1 shows a block diagram of an automotive battery state monitor apparatus according to a first embodiment of the present invention.

First, as shown in FIG. 1, a battery state monitor apparatus is comprised of a starter 1, a starter switch 2, an electric load 3, an electric current sensor 4, an automotive battery 5, an automotive battery state monitor device 6 including a memory 6a, an automotive generator 7, a voltage controller 8, an ECU (engine controller) 9, and an electric cable 10. The automotive generator 7 is driven rotatively by an engine (not shown in FIGS.) and generates electricity for charging the automotive battery 5 and operating the electric load 3.

The voltage controller 8 controls the conduction of excitation current in the field coil installed in the automotive generator 7 in order to adjust an output voltage of the generator 7 to a predetermined value. This voltage controller 8 is comprised of a power circuit that provides operating power of the attached circuit, power controlling components such as a power transistor that controls conduction of the excitation current, a logic circuit that controls conduction, and the like, all incorporated in a CMOS-IC.

The electric load 3 is an electric apparatus such as lighting or an air conditioner, or, in the recent automotive vehicles, a highly sophisticated electric device with controlling electric components installed inside.

Connection between the automotive generator 7 and the automotive battery 5, and also between the battery 5 and the electric load 3 are established by the electric cable 10. The voltage controller 8 is built into the automotive generator 7 with the required electric wiring solely contained in the automotive generator 7.

The ECU 9 is an external controlling device that controls a state of an engine, speed of a vehicle, and also generation state of the automotive generator 7, based on the rotation of the generator 7 and the like. For example, generation state information of the automotive generator 7 is sent from the voltage controller 8 to the ECU 9, and generation voltage instruction information that adjusts the output of the automotive generator 7 is sent from the ECU 9 to the voltage controller 8 in the opposite direction. This generation instruction information can also be used as generation suppression information, and thus the output of the automotive generator 7 can be suppressed by sending generation instruction information to adjust the output voltage of the automotive generator 7 to be lowered.

Also, the electric current sensor 4 is installed adjacent to one terminal of the automotive battery 5 (positive terminal, for example) as a current measurement device to pick up the charge/discharge current of the automotive battery 5. The automotive battery state monitor device 6 receives an incoming signal picked up by the current sensor 4 and also receives the terminal voltage coming from the automotive battery 5. Mapped information (FIG. 5) that correlates the OCV to the SOC on a predetermined polarization condition is stored in the automotive battery state monitor device 6.

Next, the operation of the automotive battery state monitor apparatus in this embodiment is described.

Figure 2:
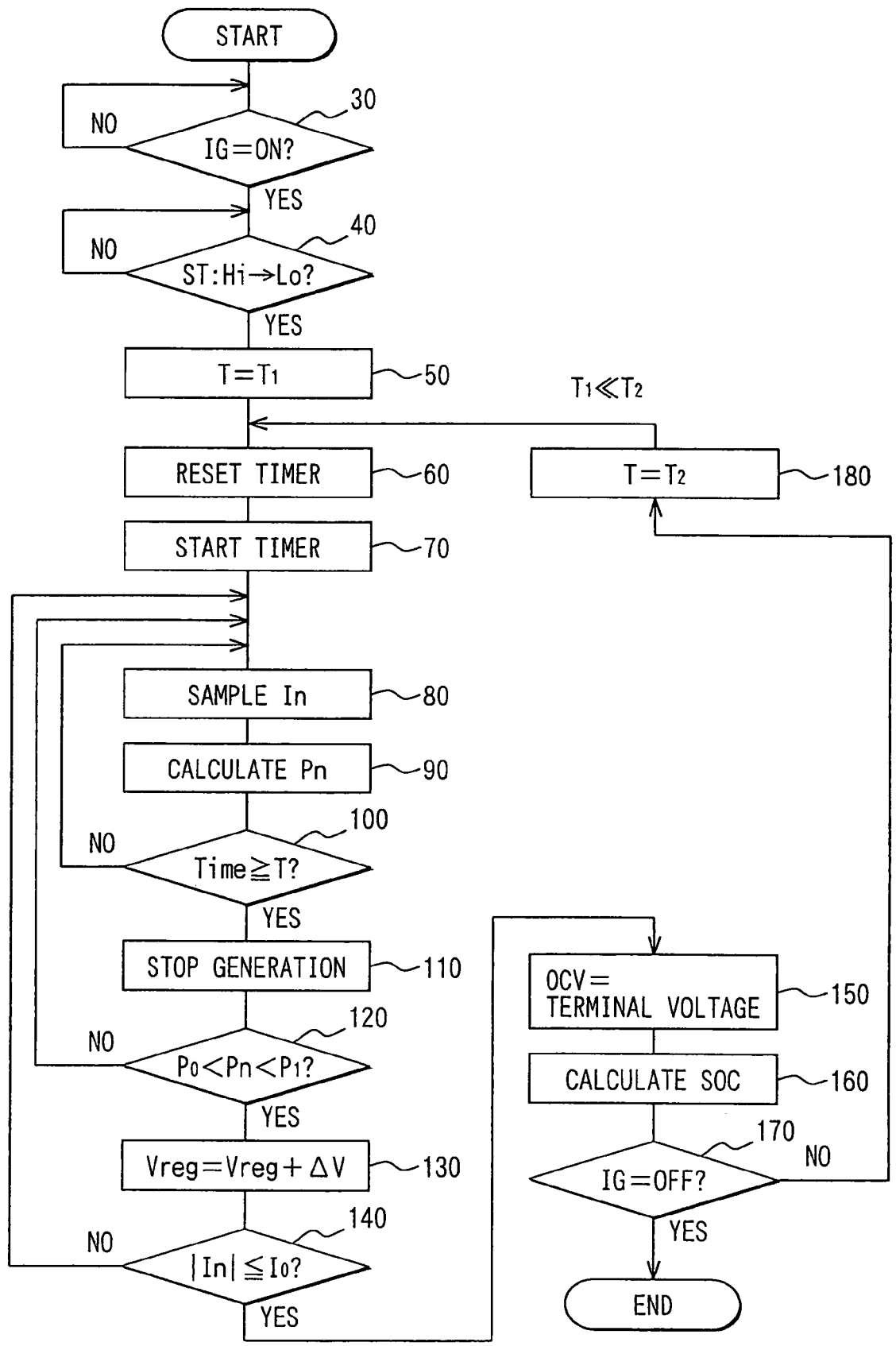
FIG. 2 shows a flow chart of an automotive battery SOC pick-up procedure while an engine is in operation in the first embodiment.
Figure 3:
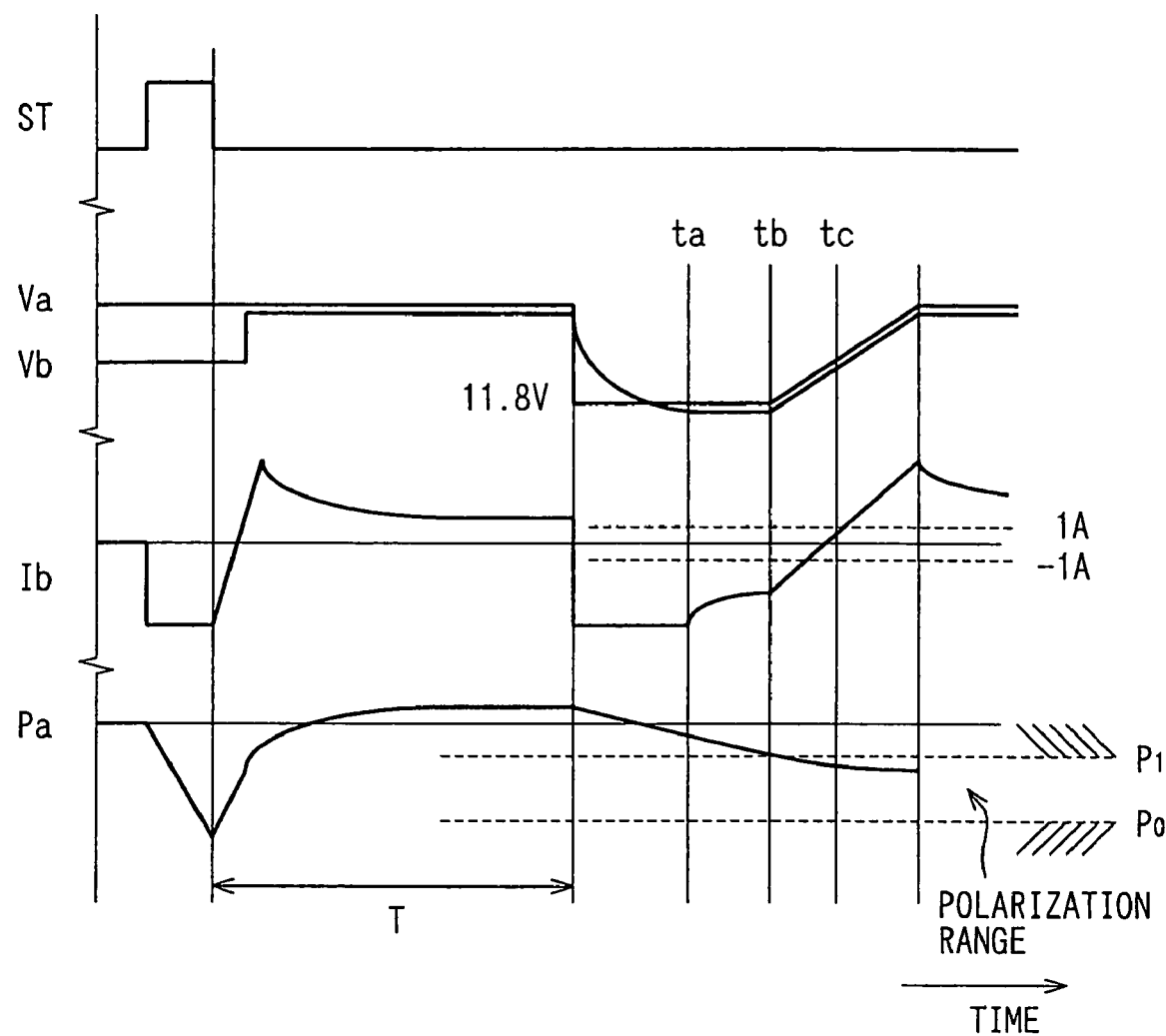
FIG. 3 shows an operation diagram that depicts the characteristics of a starter signal, a generation voltage of the automotive generator, a battery voltage, a battery current, and a polarization index, a starter signal against the elapsed time in the first embodiment.

The SOC measurement procedure for the automotive battery while an engine is running is shown in FIG. 2 as a flow chart. FIG. 3 shows operation characteristics including generation voltage Va of the generator 7, battery voltage Vb, battery current Ib, battery polarization index Pa, and starter signal ST.

In FIG. 2, when an ignition switch is judged as ON in step 30, the starter signal is checked in step 40 if it is switched from Hi to Lo. If YES, it means a high-current has been supplied to the starter motor 1 to start the engine. This starts the engine operation, and therefore the internal state of the battery 5 is not in a stable condition because of the high-current discharge and a severely polarized condition accompanying the discharge. Therefore, during a certain period of time after starting the engine, the polarization control in order to fit the polarization state to be within a predetermined range is prohibited, that is, the polarization control operation is postponed by a certain period of time $T=T_1$. A timer to measure the passage of time T is set to operate in steps 50, 60, and 70. For example, $T_1$ is set to 60 seconds in step 50, and the timer is reset in step 60 to start measuring this period $T_1$ in step 70. In step 80, the charge/discharge current $I_n$ of the battery is sampled by the current sensor 4. Then in step 90, the polarization index $P_n$ is calculated. The polarization index $P_n$, when the present charge/discharge current is picked up, is represented in the following formula, in which $P_{n-1}$ stands for polarization index of the last sampling, Δt stands for sampling interval of charge/discharge current, and τ stands for diffusion constant of electrolyte of the battery.

$$P_n = P_{n-1} + I \cdot \Delta t - P_{n-1} \cdot \Delta t / \tau$$

In step 100, when time T reaches a certain amount $T_1$, a power generation stoppage signal is sent from the automotive battery state monitor device 6 to the voltage controller 8 in step 110 to adjust the voltage Va of the automotive generator 7 to a certain value (11.8 (V), for example) (time ta in FIG. 3). Accordingly, the battery 5 is put in the discharge condition. In step 120, the polarization index $P_n$ is checked whether it fits in a predetermined range (between $P_0$ and $P_1$ in FIG. 3). When the polarization index $P_n$ fits within the predetermined range, the mapped information (FIG. 5) stored in the automotive battery state monitor device 6 can be applicable. Next, in order to calculate the SOC, while keeping the internal state of the battery 5 to be stable, the output voltage of the automotive generator 7 is controlled to gradually increase its output in step 130 from a certain voltage (11.8 (V), for example) by the voltage controller 8 (time tb in FIG. 3).

In the procedure described above, the output of the automotive generator 7 is gradually increased in order not to radically change the charge/discharge current of the battery $I_n$. In step 140, the terminal voltage of the battery is checked whether the battery charge/discharge current reaches to fit within the predetermined small range (±1 A, for example) (time tc in FIG. 3). The controlled charge/discharge current $I_n$ fitted within the predetermined small range is created in order to closely simulate (virtually create) the condition where the terminal of the battery 5 is physically released.

Based on this condition (YES in step 140), the terminal voltage of the battery 5 is measured in step 150 to be regarded as the OCV.

Figure 5:
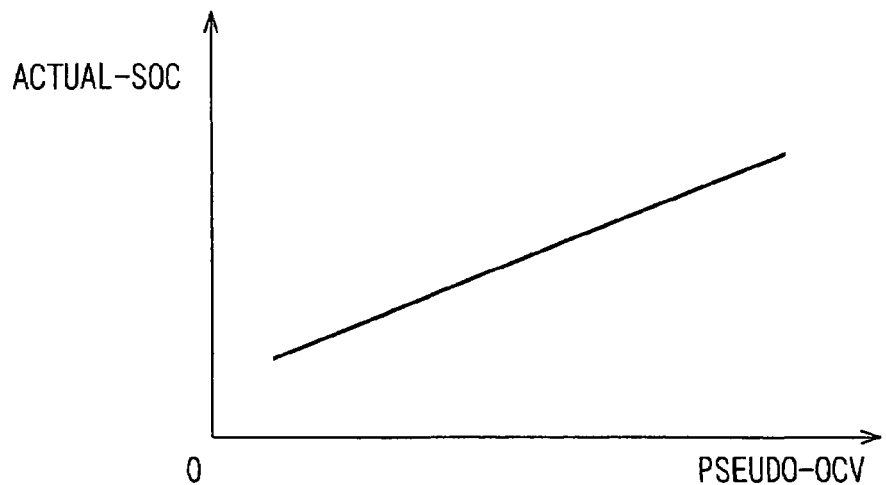
FIG. 5 shows a relation of the actual SOC to the pseudo-OCV.

FIG. 5 shows a relation of the battery SOC characteristics against the OCV. Using this relation, the SOC of the battery is calculated from the OCV of the battery in step 160.

By using the method described in the first embodiment, without actually releasing the terminal, a standard for SOC calculation at the time of OCV measurement is calculated. Thereafter, the actual SOC of a running vehicle is calculated by iterative addition of the difference (integration value) of charge/discharge current $I_n$.

Figure 4:
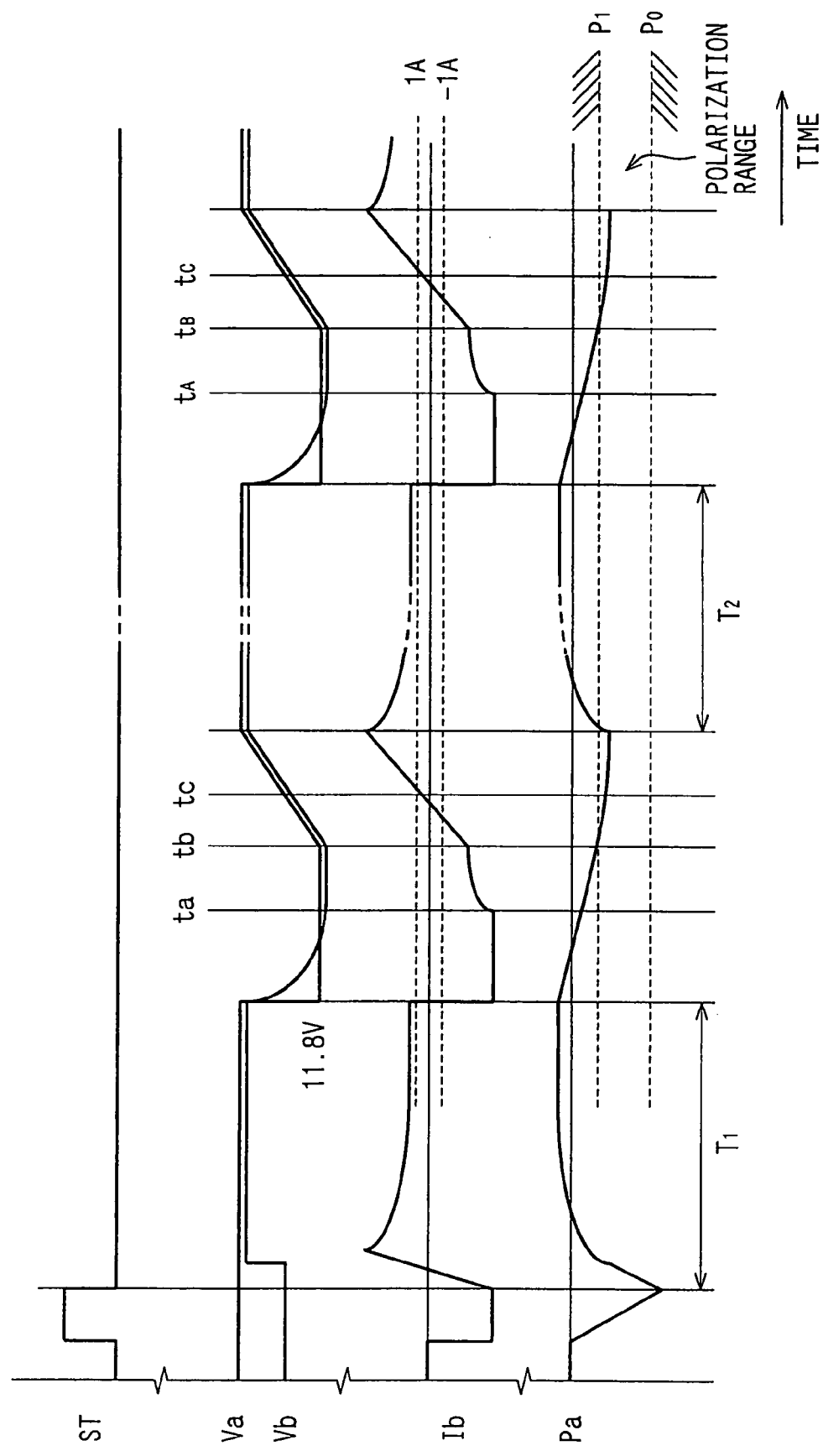
FIG. 4 shows an operation diagram that depicts the characteristics of a starter signal, a generation voltage of the automotive generator, a battery voltage, a battery current, and a polarization index, against the elapsed time when a periodical SOC measurement is executed.

Although, in the first embodiment, a case where passage time after starting of the engine is $T_1$ is described, a similar case where the output of an automotive generator is periodically controlled while an engine is in operation by repeating steps 60 to 170 through step 180 in order for the battery charge/discharge current to fit within the predetermined small range by gradually increasing the output of the generator in succession to a temporal stoppage (assuming $T_2$ as in $T_1 << T_2$, or several hours, for example) is shown in FIG. 4 (see times tA, tB and tC). By calculating the pseudo-OCV periodically, the integration of tolerance originating from the electric current sensor, known as a demerit of the charge/discharge current integration method, can be periodically diminished.

Figure 6:
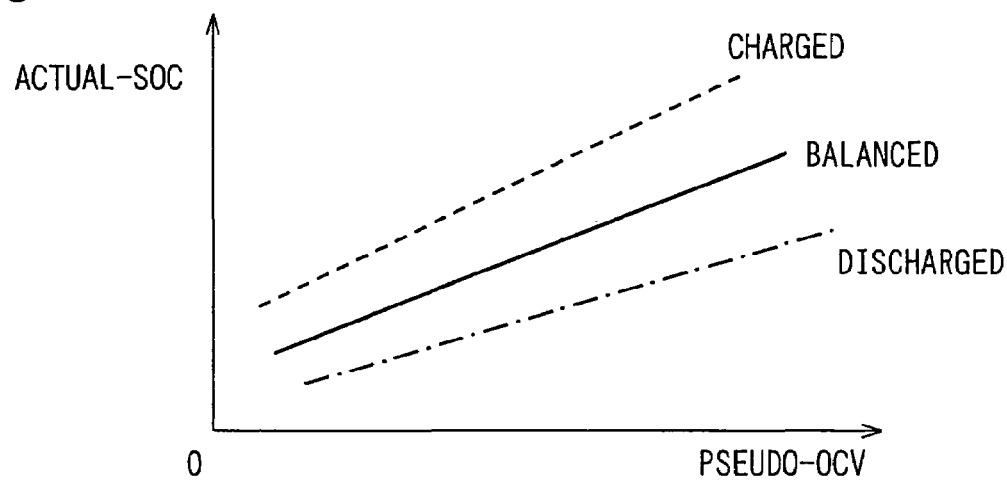
FIG. 6 shows a relation of the actual SOC to the pseudo-OCV in a polarization state.

FIG. 6 shows the relation between the pseudo-OCV and the actual SOC in three conditions. Charged, balanced, and discharged condition respectively indicate that the condition of the vehicle is either running, parking after running, or standing for a long period of time.

Figure 7:
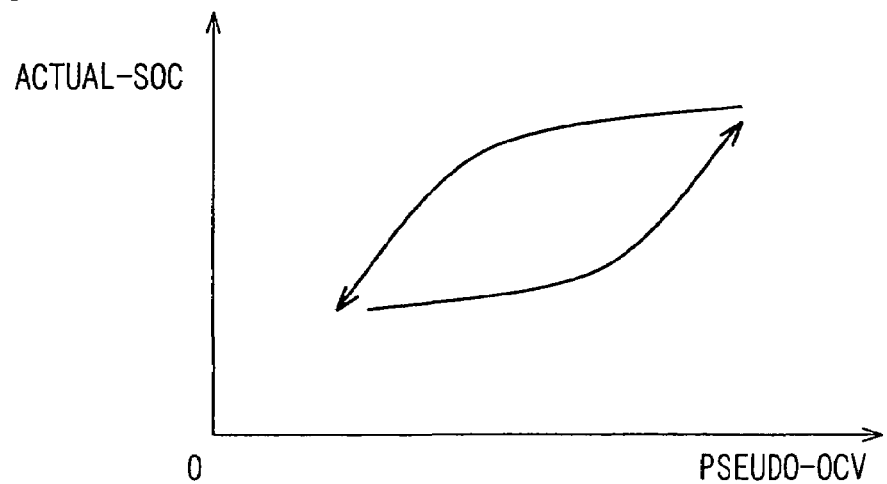
FIG. 7 shows a relation of the actual SOC to the pseudo-OCV in charging and discharging processes.

The hysteresis curve paths in FIG. 7 represent that the relation between the pseudo-OCV and the actual SOC cyclically changes along those curves corresponding to the conditions of the vehicle. That is, when the vehicle is running, the actual SOC increases steeply against the pseudo-OCV (the lower path), and when the vehicle is parked, the actual SOC decreases against the pseudo-OCV with gradually adding its decrease rate (the upper path). The charging and discharging processes take this kind of hysteretic curve paths because of the delay of the polarization in the battery.

Second Embodiment

The automotive battery state monitor apparatus has the similar structure as described in the first embodiment. However, the battery state monitor device 6 operates during an engine stoppage period as shown in FIGS. 9 and 10.

Figure 9:
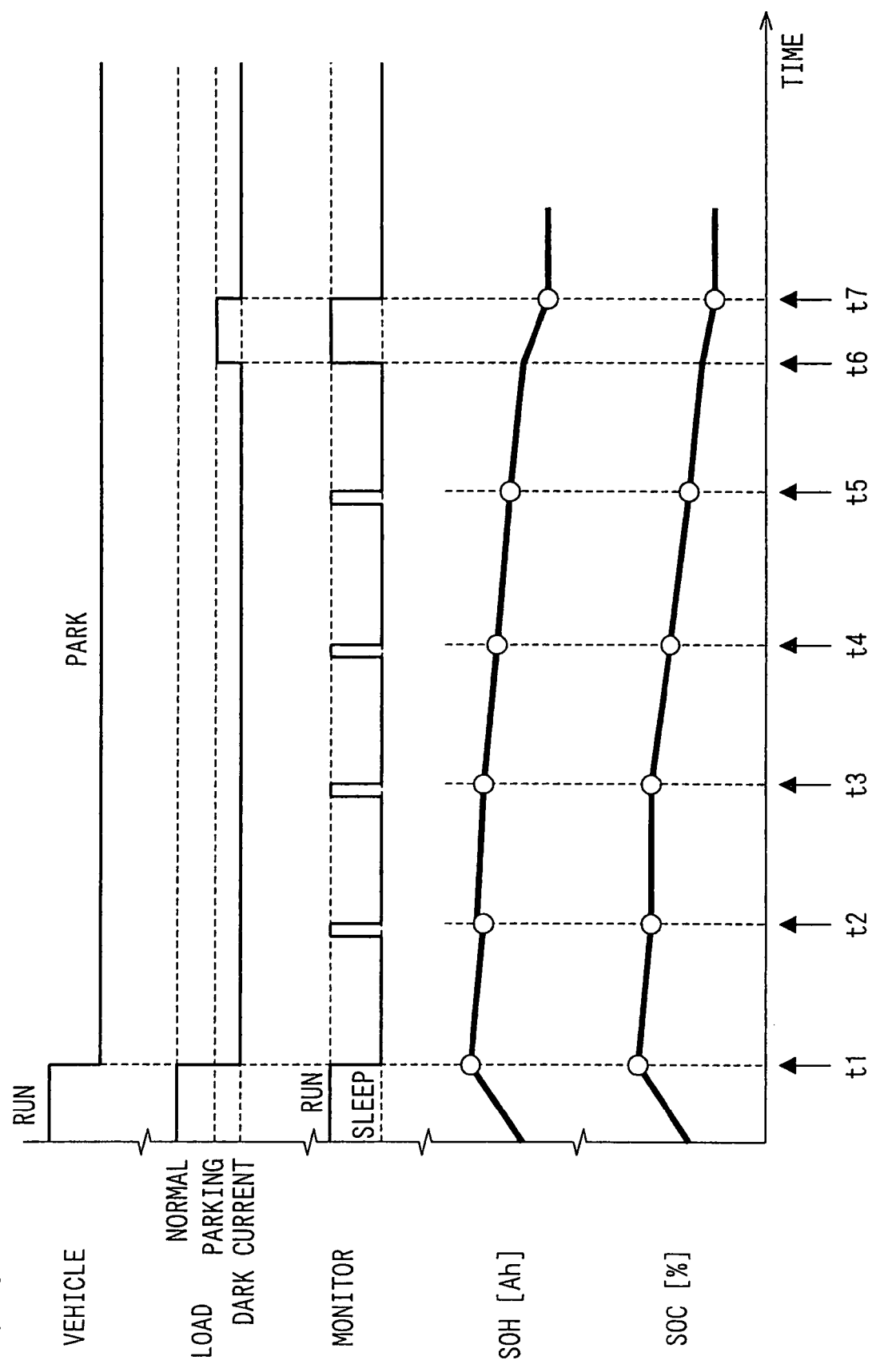
FIG. 9 shows an operation diagram of an electric load, a battery state monitor device state, the SOC, and the SOH during an engine stoppage period in a second embodiment of the present invention.

FIG. 9 shows the characteristics of an electric load state, a battery state monitor device (battery state monitor apparatus) state, the SOC, and the SOH during an engine stoppage period.

The battery state monitor device 6 saves to memory the SOC and the SOH at time (t1) of turning off the engine as an SOC1 and an SOH1. Then, after saving to memory, the battery state monitor device 6 ceases to operate and enters into a sleep mode.

Then, the battery state monitor device 6 thereafter automatically wakes up and enters into a run mode at time (t2) after a predetermined period of time (3 hours, for example) by using its own timer. In this case, a timer operation current is nominal in terms of battery capacity, and does not cause lowering of the capacity. Battery terminal voltage value is picked up as a pseudo-OCV (V2 in FIG. 8 similar to FIG. 5), and an SOC2 is calculated by using the characteristics in FIG. 8. This condition closely simulates a state that the battery 5 is kept with its terminals physically released from a circuit because the dark current coming into the battery 5 is nominal.

The present SOH is calculated as an SOH2 based on the SOC2 above, and also on the SOC1 and the SOH1 both stored in the battery state monitor device 6.

In this case, the SOH2 is defined from the SOC1, the SOH1, and the SOC2 using the following formula.

$$SOH2 = (SOH1/SOC1) \cdot SOC2 \qquad (1)$$

After completing the calculation, the contents of the SOC1 and the SOH1 are replaced with the contents of the SOC2 and the SOH2 respectively. That is, the SOC and the SOH are updated and stored.

Further, after passage of a predetermined time, that is at times t3, t4, t5, the battery state monitor device 6 wakes up again and picks up the battery terminal voltage, and then calculates the SOC2 and the SOH2 at respective times. After the calculation, the contents of the memory 6a are updated in the same way.

The monitoring operation described above is repeated in this manner when a vehicle is kept parked and therefore an electric load is nothing but a nominal dark current.

Therefore, while the engine is not in operation, the SOC and the SOH can always be measured, a more accurate internal state can be understood. Also, contents of the memory 6a are periodically updated on the occasion when the SOC and the SOH are measured, required memory capacity can be minimized.

In this second embodiment, the battery state monitor device 6 further operates in the manner described below when a parking load is engaged while the engine is not running.

When a parking load (security-related state monitor device, for example) is engaged at time t6 while the engine is not running, the battery state monitor device 6 detects the engaged load and automatically wakes up and starts integration of the discharging current. The battery state monitor device 6 adds this integration value to the stored SOH1 to update the monitor condition.

Based on this SOH2, and also on the SOC1 and the SOH1 stored in the battery state monitor device 6, the present SOC value is calculated as the SOC2. In this case, the SOC2 is defined in the following formula, based on the SOC1, the SOH1, and the SOH2.

$$SOC2 = (SOC1/SOH1) \cdot SOH2 \qquad (2)$$

The monitor operation is continued until time t7 while the parking load is in operation.

In this manner, when the parking load is put in operation while the engine is not running, the SOC and the SOH can always be measured, and thus a more accurate internal state can be understood. Also, contents of the memory 6a are periodically updated on the occasion when the SOC and the SOH are measured, required memory capacity can be minimized.

A series of operation patterns of a vehicle such as parking, running and then parking again in FIG. 10 is taken as an example to describe the operation of the battery state monitor device 6 in various situations.

First, the discharge current of the battery 5 and the terminal voltage are picked up at starting of the engine (time t10). Then the internal resistance is calculated and the present residual capacity SOH [Ah] of the battery 5 is determined as the initial value. Then the battery charge/discharge current is integrated whenever necessary, and the residual capacity SOH is calculated by successively adding the integration value to the initial value for monitoring while a vehicle is running (until time t40).

Next, when a certain period of time after starting the engine (time t20) has passed, controlled monitoring is made in order to achieve the polarization state of the battery 5 to fit in the predetermined range by temporarily stopping the automotive generator 7. After achieving the polarization state of the predetermined range, the output of the generator 4 is gradually increased to see whether the absolute value of the charge/discharge current of the battery 5 is under the predetermined value. When the electric current fits in the predetermined range (±1 A, for instance) as shown in FIGS. 3 and 4, the terminal voltage of the battery 5 is measured as the pseudo-OCV. Then, the charge rate SOC corresponding to the pseudo-OCV is calculated using the relation of FIG. 8, and the SOC value at that time is determined as an initial SOC (time t30). Then, the integration of charge/discharge current is thereafter continued while successively adding the integration value to the initial SOC until time t40, to monitor the SOC.

Next, the monitor operation when a vehicle is not running is described.

At the time t40, a parking load (security-related state monitor device, for example) is in operation, the battery state monitor device 6 is kept in running state to monitor the SOC and the SOH by successively acquiring integration of charge/discharge current.

When the parking load is turned off, the SOC and the SOH at that time are stored as the SOC1 and the SOH1 (time t50). After storing them, the battery state monitor device 6 ceases to operate and enters into the sleep mode.

Figure 8:
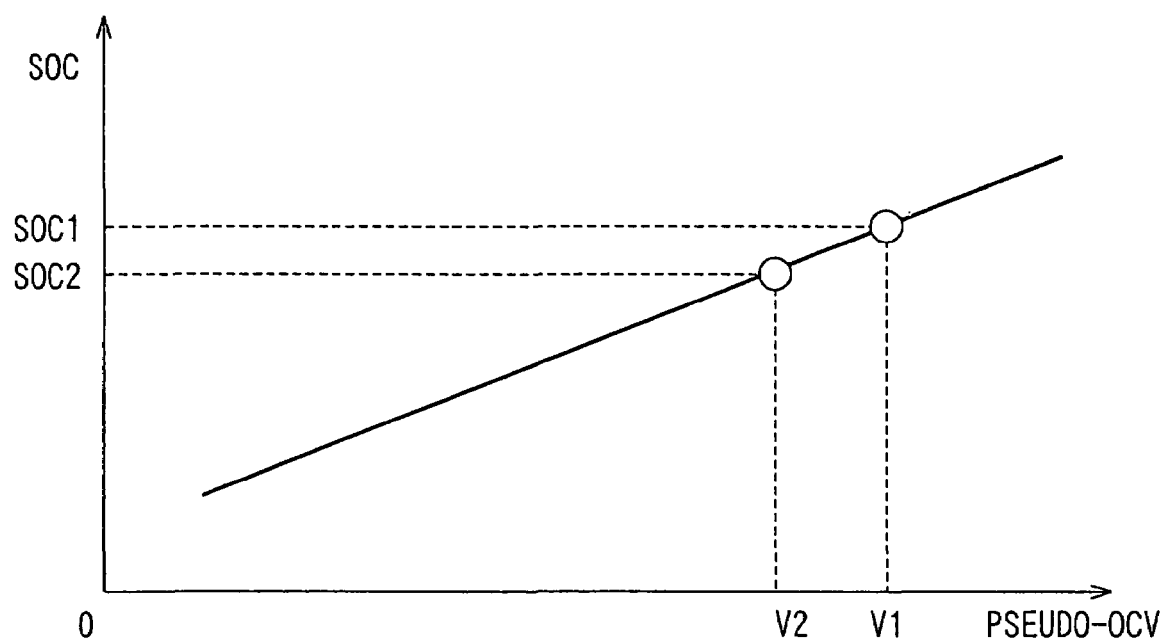
FIG. 8 shows a relation of the actual SOC to the pseudo-OCV.

Then, the battery state monitor device 6 thereafter (automatically wakes up and enters into a run mode after a certain period of time by using its own timer) periodically picks up battery terminal voltage as the pseudo-OCV (V2 in FIG. 8), and the SOC2 is calculated by using the present SOC based on the characteristics in FIG. 8. Based on the SOC2 and formula (1), the SOH at present is calculated as an SOC2 (time t60). After completing this calculation, the contents of the SOC1 and the SOH1 are replaced with the contents of the SOC2 and the SOH2 respectively, that is, the SOC1 and the SOH1 are updated and stored.

Further, after passage of the predetermined time (time t70), the battery state monitor device 6 wakes up again and picks up the battery terminal voltage, and then calculates the SOC2 and the SOH2 at the time t70. After the calculation, the contents of the memory 6a are updated in the same way.

The monitor operation described above is repeated in this manner when a vehicle is parked and therefore an electric load is nothing but a nominal dark current.

When a parking load is engaged (time t90), the battery state monitor device 6 detects the engaged load and automatically wakes up and starts integration of discharging current. The monitor device adds this integration value to the SOH1 to update the monitor condition. Then, SOC2 is calculated successively using the formula (2). The monitoring operation is continued while the parking load is in operation (until time t100).

When only a dark current flows again, the battery state monitor device 6 enters into the sleep mode and periodically monitors an incoming new load. When ignition is turned on and an engine is started before the predetermined time, the battery state monitor device 6 again calculates the initial SOH (time t110) by picking up the value of the charge current of starting an engine and the terminal voltage and by calculating the internal resistance, then repeat the above monitor operation described with reference to time after t10.

The present invention should not be limited to the disclosed embodiments, but may be modified in many ways without departing from the spirit of the invention.

What is claimed is:

1. An automotive battery state monitor apparatus comprising:
    an automotive generator driven by an engine;
    a controlling device that controls the generator;
    an automotive battery to store electricity generated by the generator;
    means for measuring a period of time, which elapses from a completion of starting of an engine;
    means for comparing the period of time measured by the measuring means with a predetermined period of time;
    means for stopping the automotive generator temporarily during running of the engine to put polarization of the battery in a discharge condition, when the means for comparing indicates that the measured period of time reaches the predetermined period of time;
    means for increasing an output of the generator gradually after stopping the generator and after the polarization of the battery is put in the discharge condition; and
    means for picking up a battery voltage value as an open circuit voltage of the battery when a battery charge/discharge current reaches within a predetermined small range near zero.

2. The automotive battery state monitor apparatus according to claim 1, wherein the stopping means controls a polarization state in the battery to stay within a predetermined range by controlling the output of the generator.

3. The automotive battery state monitor apparatus according to claim 1, wherein the predetermined range is a value between plus one ampere and minus one ampere.

4. The automotive battery state monitor apparatus according to claim 2, wherein the stopping means stops the generator for another predetermined period of time after starting of the engine.

5. The automotive battery state monitor apparatus according to claim 2, wherein the polarization state of the battery is defined as a polarization index $P_n$ defined in the following formula:

$$P_n = P_{n-1} + I \cdot \Delta t - P_{n-1} \cdot \Delta t / \tau$$

where
$P_{n-1}$: polarization index of the last sampling
$\Delta t$: sampling interval of charge/discharge current
$\tau$: diffusion constant of electrolyte of the battery
I: electric current value.

6. The automotive battery state monitor apparatus according to claim 1, wherein a battery charge rate of the battery is calculated as an initial charge rate by using the open circuit voltage picked up when the charge/discharge current of the battery fits within the predetermined range.

7. The automotive battery state monitor apparatus according to claim 6, wherein the battery charge rate is calculated successively as a sum of repeated addition of a value to the initial charge rate by deriving added value as the product of the sampled current value and a sampling interval divided by the battery capacity when the charge/discharge current is sampled at the sampling interval.

8. The automotive battery state monitor apparatus according to claim 1, wherein the output increasing means periodically performs a controlled increase of the output of the generator after a temporal stoppage for the battery charge/discharge current to fit within the predetermined range while an engine is running.

9. The automotive battery state monitor apparatus according to claim 1, wherein the output increasing means performs a periodically controlled increase of the output of the generator after a temporal stoppage, with the period of time prior to a first stoppage being different from the others, for the battery charge/discharge current to fit within the predetermined range while an engine is running.

10. The automotive battery state monitor apparatus according to claim 1, the output increasing means further performs a periodically controlled increase of the output of the generator after a temporal stoppage, with the increase rate accordingly controlled based on a hysteretic curve relation between a terminal voltage and an actual-SOC, for the battery charge/discharge current to fit within the predetermined range while an engine is running.

11. An automotive battery state monitor method, comprising:

measuring a period of time elapsing from a completion of starting an engine by a starter;

stopping an automotive generator, which is driven by the engine to charge a battery, after the measured period of time reaches a predetermined period of time, to put polarization of the battery in a discharge condition while maintaining operation of the engine;

determining whether polarization of the battery is within a predetermined polarization range;

driving the automotive generator again by the engine to gradually increase an output voltage of the automotive generator after the polarization of the battery is put in the discharge condition, when the polarization of the battery is determined to be within the predetermined polarization range;

determining whether a charge/discharge current of the battery is within a predetermined current range near zero corresponding to a battery open circuit;

detecting a terminal voltage of the battery as an open circuit voltage when the charge/discharge current of the battery is determined to be within the predetermined current range; and calculating a state of charge of the battery based on the open circuit voltage.

* * * * *